(12) United States Patent
Morizumi

(10) Patent No.: US 8,654,808 B2
(45) Date of Patent: Feb. 18, 2014

(54) NITRIDE SEMICONDUCTOR LASER ELEMENT AND METHOD FOR MANUFACTURING SAME

(75) Inventor: Tomonori Morizumi, Anan (JP)

(73) Assignee: Nichia Corporation, Anan-shi (JP)

( * ) Notice: Subject to any disclaimer, the term of this patent is extended or adjusted under 35 U.S.C. 154(b) by 171 days.

(21) Appl. No.: 13/194,046

(22) Filed: Jul. 29, 2011

(65) Prior Publication Data

US 2012/0033698 A1 Feb. 9, 2012

(30) Foreign Application Priority Data

Aug. 6, 2010 (JP) ................................. 2010-177270

(51) Int. Cl.
*H01S 5/00* (2006.01)
(52) U.S. Cl.
USPC .............. 372/45.011; 372/43.01; 372/44.011; 372/49.01
(58) Field of Classification Search
USPC .................. 372/45.011, 43.01, 44.011, 49.01
See application file for complete search history.

(56) References Cited

U.S. PATENT DOCUMENTS

| 6,711,191 B1* | 3/2004 | Kozaki et al. ............. 372/43.01 |
| 2003/0091079 A1* | 5/2003 | Yokota ............................ 372/44 |
| 2006/0043419 A1* | 3/2006 | Tachibana et al. ............ 257/200 |
| 2006/0133442 A1 | 6/2006 | Kondou et al. |
| 2007/0025231 A1 | 2/2007 | Ochiai et al. |
| 2008/0157106 A1* | 7/2008 | Masui et al. ..................... 257/94 |
| 2008/0181274 A1* | 7/2008 | Michiue et al. .......... 372/44.011 |
| 2008/0198886 A1 | 8/2008 | Michiue et al. |
| 2009/0010294 A1* | 1/2009 | Morizumi et al. ......... 372/49.01 |
| 2009/0162962 A1 | 6/2009 | Suzuki et al. |
| 2010/0159626 A1 | 6/2010 | Kondou et al. |
| 2010/0248406 A1* | 9/2010 | Masui et al. ..................... 438/39 |
| 2011/0007770 A1 | 1/2011 | Kondou et al. |
| 2012/0189030 A1* | 7/2012 | Miyoshi ................... 372/45.012 |

FOREIGN PATENT DOCUMENTS

| JP | 2007-059897 A | 3/2007 |
| JP | 2008-227002 A | 9/2008 |
| JP | 2009-152276 A | 7/2009 |
| JP | 2010-068007 A | 3/2010 |

* cited by examiner

*Primary Examiner* — Jessica Stultz
*Assistant Examiner* — Delma R Forde
(74) *Attorney, Agent, or Firm* — Global IP Counselors, LLP

(57) ABSTRACT

A nitride semiconductor laser element has: a nitride semiconductor layer having cavity planes at the ends of a waveguide region, an insulating film formed on an upper face of the nitride semiconductor layer so that the ends on the cavity plane side are isolated from cavity planes, and a first film formed from the cavity plane to the upper face of the nitride semiconductor layer, and covered part of the insulating film surface, the first film has a first region that is in contact with the nitride semiconductor and a second region that is in contact with the insulating film, and is formed from $Al_xGa_{1-x}N$ ($0<x\leq1$) and a different material from that of the insulating film.

15 Claims, 6 Drawing Sheets

NITRIDE SEMICONDUCTOR LASER ELEMENT AND METHOD FOR MANUFACTURING SAME

CROSS-REFERENCE TO RELATED APPLICATIONS

This application claims priority to Japanese Application No. 2010-177270 filed in Japan on Aug. 6, 2010. The entire disclosures of Japanese Application No. 2010-177270 is incorporated hereinto by reference.

BACKGROUND OF THE INVENTION

1. Field of the Invention

This invention relates to a nitride semiconductor laser element and a method for manufacturing the same.

2. Background Information

As shown in JP-2009-152276A and JP-2010-68007A, an example of a nitride semiconductor laser element is one in which a nitride semiconductor layer is formed on a substrate, and an insulating film and an electrode are formed on the top face of this. An end face protective film is formed on the cavity plane thereof. As shown in JP-2007-59897A, the end face protective film is sometimes formed so that it goes around the top face of the nitride semiconductor layer.

The end face protective film is preferably formed so that it will have good adhesion to the cavity plane not only during formation, but also after drive time has elapsed, and the material, film thickness, and so forth are adjusted to this end. It has been disclosed that with a nitride semiconductor laser element, forming an end face protective film composed of a nitride and hexagonal crystals reduces the damage to the cavity plane, or improves adhesion between the cavity plane and the end face protective film (JP-2009-152276A and JP-2010-68007A).

However, when an end face protective film is actually formed from such materials and then subjected to an expected-life characteristics test, there are sometimes elements with poor service life characteristics, in which a sudden rise in drive current is seen. With an element with poor service life characteristics, degradation is observed in the nitride semiconductor layer near the cavity plane.

SUMMARY OF THE INVENTION

The present invention was conceived light of the above problems, and it is an object thereof to provide a nitride semiconductor laser element with which degradation of the cavity plane can be suppressed and the service life characteristics of the element can be improved, as well as a method for manufacturing this element.

The present invention provides a nitride semiconductor laser element having:

a nitride semiconductor layer having cavity planes at the ends of a waveguide region, an insulating film formed on an upper face of the nitride semiconductor layer so that the ends on the cavity plane side are isolated from cavity planes, and a first film formed from the cavity plane to the upper face of the nitride semiconductor layer, and covered part of the insulating film surface, the first film has a first region that is in contact with the nitride semiconductor and a second region that is in contact with the insulating film, and is formed from $Al_xGa_{1-x}N$ ($0<x\leq 1$) and a different material from that of the insulating film.

Also, the present invention provides a method of manufacturing a nitride semiconductor laser element having:

forming an insulating film on an upper face of a nitride semiconductor layer;

forming cavity planes substantially perpendicular to the upper face of the nitride semiconductor layer such that the cavity planes are apart from the end portions of the insulating film, and forming a first film from $Al_xGa_{1-x}N$ ($0<x\leq 1$) and a different material from that of the insulating film to have a first region that is in contact with the nitride semiconductor and a second region that is in contact with the insulating film.

According to the nitride semiconductor laser element of the present invention, degradation of the cavity plane can be suppressed and the service life characteristics of the element can be improved.

DETAILED DESCRIPTION OF THE PREFERRED EMBODIMENTS

Figure 1:
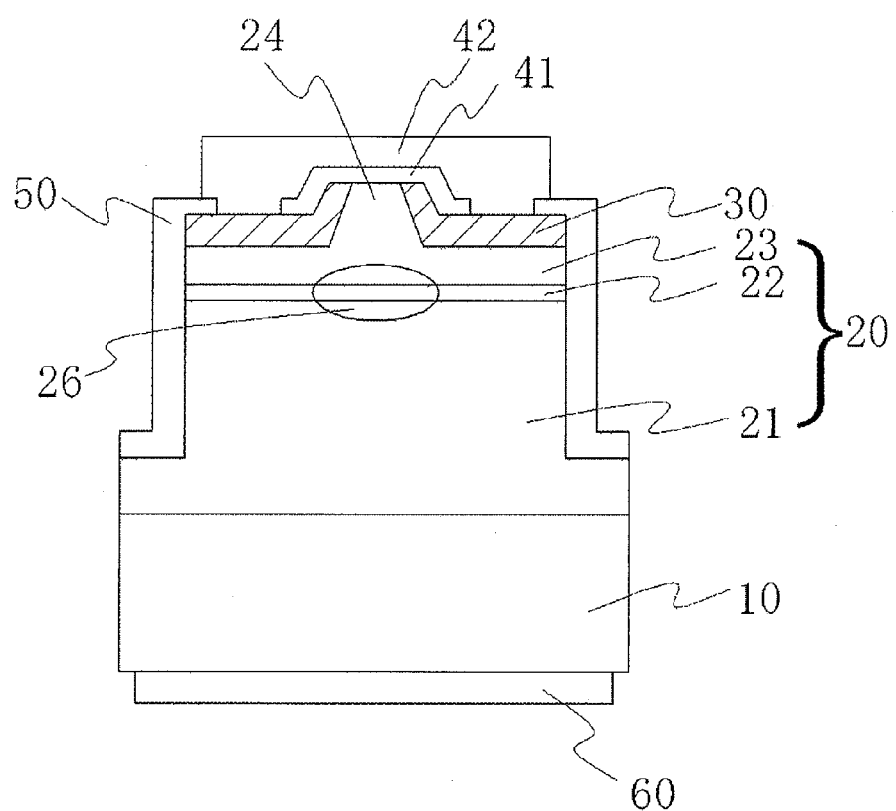
FIG. 1 is a simplified cross section view describing the structure of the nitride semiconductor laser element of one embodiment according to the present invention.

As shown in FIG. 1, for example, with this nitride semiconductor laser element, an n-side semiconductor layer 21, an active layer 22, and a p-side semiconductor layer 23 are formed as a nitride semiconductor layer 20 on a substrate 10. A ridge 24 is formed on the top face of the nitride semiconductor, a waveguide region 26 is provided beneath the ridge. The nitride semiconductor layer 20 has cavity planes at the ends of a waveguide region 26. The cavity planes are formed substantially perpendicular to the upper face of the nitride semiconductor layer. An insulating film 30 is formed from the side faces of the ridge 24 all the way to the top face of the nitride semiconductor layer. A p-side electrode 41 is formed on the top face of the ridge 24, and an n-side electrode 60 is formed on the rear face of the substrate. A protective film 50 is formed on the side faces of the nitride semiconductor layer.

A p-pad electrode 42 is formed on the top faces of the insulating film 30, the p-side electrode 41, and the protective film 50.

Figure 2:
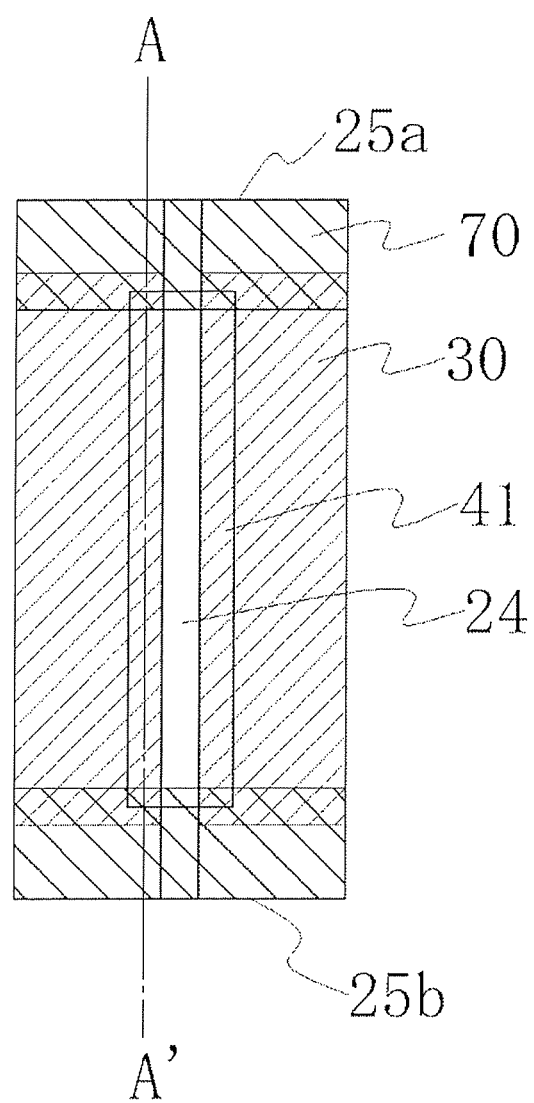
FIG. 2 is a simplified plan view describing the structure of the nitride semiconductor laser element of one embodiment according to the present invention.
Figure 3:
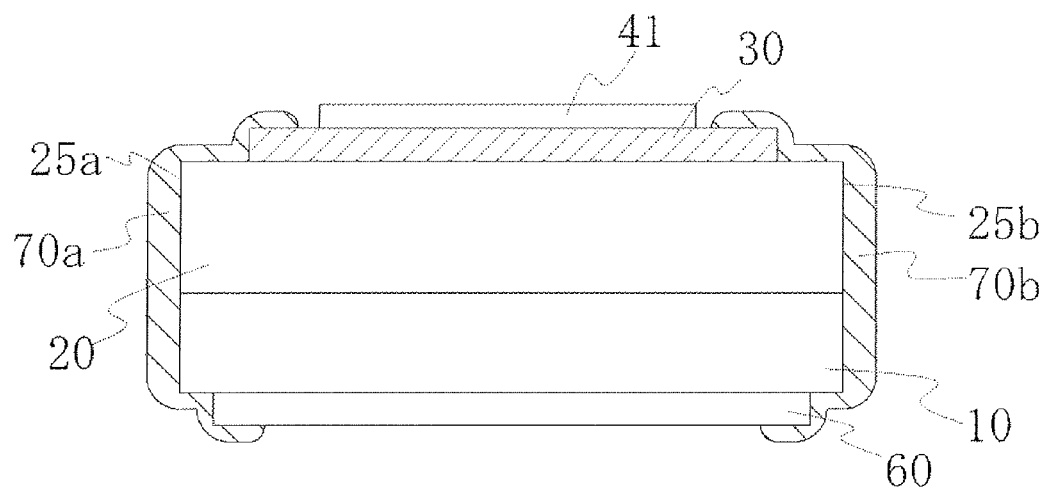
FIG. 3 is a simplified cross section view along the cavity direction describing the structure of the nitride semiconductor laser element of one embodiment according to the present invention.
Figure 4:
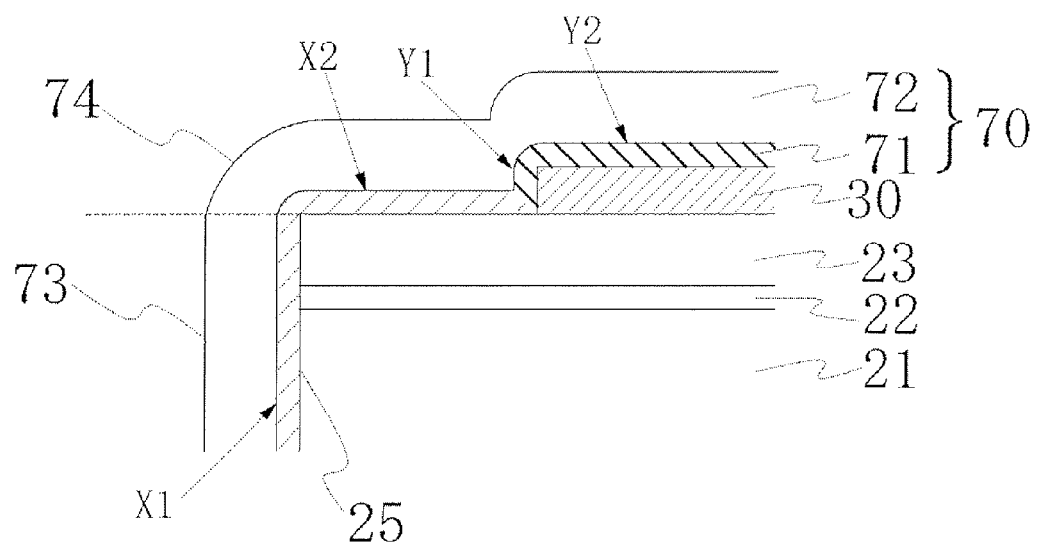
FIG. 4 is a main enlarged view describing the structure of the nitride semiconductor laser element of one embodiment according to the present invention.

As shown in FIG. 2, the insulating film 30 is formed so that the ends on the cavity plane side are isolated from cavity planes 25a and 25b. As shown in FIGS. 3 and 4, end face protective films 70a and 70b are formed on the cavity planes 25a and 25b. The end face protective films 70 are each formed from the cavity plane to the upper face of the nitride semiconductor layer, and cover part of the insulating film surface.

With this nitride semiconductor laser element, as shown in FIG. 4, the end face protective films 70 each comprise a first film 71 that is in contact with the cavity plane 25, and a second film 72 formed on the first film 71. That is, the first film 71 of the end face protective films 70 is also formed from the cavity plane to the upper face of the nitride semiconductor layer, and cover part of the insulating film surface. In FIGS. 2 and 3, the pad electrode and the protective films are omitted to facilitate description.

With this nitride semiconductor laser element, the first film 71 has a first region X that is in contact with the nitride semiconductor, and a second region Y that is in contact with the insulating film. Consequently, there is less degradation of the cavity plane, and the service life characteristics of the element are improved. The first region X includes a portion on the cavity plane (region X1) and a portion on the top face of the nitride semiconductor layer (region X2), and the second region Y includes the end face of the insulating film (the face substantially parallel to the cavity plane; region Y1) and the insulating film surface (region Y2). That is, the first film is formed from the cavity plane to the upper face of the nitride semiconductor layer, and covered part of the insulating film surface.

If the first film of the end face protective films is formed from a material having a hexagonal crystal structure, then good adhesion between the cavity plane and the end face protective film can be maintained on the cavity plane, that is, in the region in contact with the nitride semiconductor. However, if the end face protective films are formed only on the cavity planes, it is believed that cracks will develop in the nitride semiconductor layer due to a difference in the lattice constants of the nitride semiconductor layer and the first film, or to load on the semiconductor layer caused by stress in the first film. In view of this, if a region that is in contact with the first film and the insulating film is provided as a second region, it is believed that this will lessen the stress in the first region, allowing good adhesion to be maintained between the first film and the nitride semiconductor layer.

The inventors believe that the sudden rise in drive current of a nitride semiconductor laser element is attributable to heat generated as a result of light absorbed near the cavity plane, and this led to the following speculation. The first film formed in contact with a material other than a nitride semiconductor undergoes modification over time or cannot maintain the same crystal state as the first film on the nitride semiconductor at that position, and consequently absorbs light and becomes a source of heat generation, and this seems to be what causes the drive current to rise suddenly. An insulating film is formed at a location near the waveguide region. Also, it is usually formed over the entire cavity plane direction so that the nitride semiconductor layer will not come into contact with the electrode anywhere but in the current injection region. It is believed that if the first film is provided in contact with the insulating film, and if a region of the first film that is in contact with the insulating film is present near the cavity plane, then the light and heat generated by drive of the laser element may result in a sudden rise in drive current. In view of this, the inventors perfected the present invention by realizing that if a second region is formed apart from the cavity plane, this will prevent light from being absorbed near the cavity plane, and prevent a sudden rise in drive current.

In other words, because of the difference in what lies under the first film formed on the insulating film, the crystal state and film properties differ from those of the end face protective film formed on the cavity plane of the nitride semiconductor layer, and the second region maintains good adhesion between the first film and the nitride semiconductor, but on the other hand, this also seems to be a source of light absorption, which is the cause of a sudden rise in drive current. If this second region is isolated from the area near the cavity plane, good adhesion can be maintained between the first film and the nitride semiconductor, while a rise in drive current can be suppressed.

(Insulating Film)

The insulating film is provided to the top face of the nitride semiconductor layer to confine to a specific region the current supplied to the nitride semiconductor layer. Accordingly, the insulating film is provided outside the region in contact with the electrode on the top face of the nitride semiconductor. For example, with the ridge structure shown in FIG. 1, the insulating film is provided to the side faces of the ridge and to the nitride semiconductor layer top face on either side thereof. Part of the ridge side faces here may be left exposed.

As shown in FIG. 2, the insulating film is such that the end on the cavity plane side is apart from the cavity plane. This is because the second region is formed apart from the cavity plane. Preferably, at least the second region is formed far enough away that there will be no effect on end face degradation. It is also preferable if the length of the electrode provided to the current injection region is taken into account here. More specifically, the distance away from the cavity plane is about 1 to 20 μm, and preferably 3 to 10 μm. Also, providing the end of the insulating film away from the cavity plane makes it less likely that flash or the like of the insulating film will adhere to the cavity plane after the cavity plane has been formed.

Figure 5:
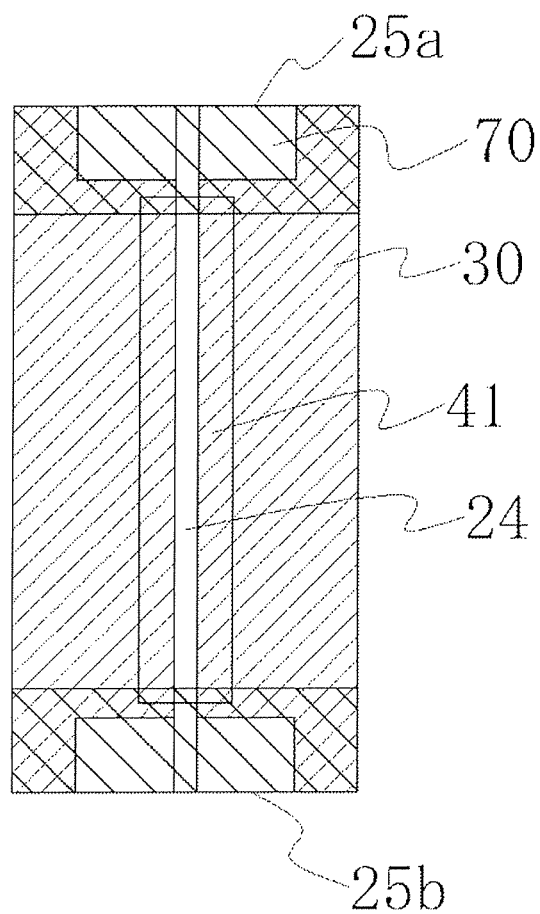
FIG. 5 is a simplified plan view describing the structure of the nitride semiconductor laser element of another embodiment according to the present invention.

The insulating film may be apart over the entire width direction of the nitride semiconductor laser element (the direction perpendicular to the cavity plane direction) as shown in FIG. 2, or may be apart only partially as shown in FIG. 5. At least the area around the waveguide region should be apart. More specifically, the insulating film is preferably exposed over a width of at least 5 μm from the bottom part of the ridge. It is also preferable for the isolation region to be provided on both sides of the ridge.

The insulating film can be formed in a specific region by photolithography, a lift-off method, or patterning by etching.

The insulating film is made from a different material from that of the nitride semiconductor and the first film so that the crystal states will be different in the first and second regions. Furthermore, the insulating film is preferably formed from a material having a crystal structure other than hexagonal. If the insulating film is formed in multiple layers, the uppermost layer may be formed from a different material from that of the first film.

The insulating film is preferably formed from an insulating material, and one whose refractive index is lower than that of the nitride semiconductor, in order to confine light in the waveguide region. Examples include materials containing one or more elements selected from the group consisting of silicon, zirconium, aluminum, titanium, vanadium, niobium, hafnium, and tantalum. Specific examples thereof include $ZrO_2$, $HfO_2$, $SiO_2$, $Ta_2O_5$, SiN, SiON, BN, SiC, and SiOC. Among these, $ZrO_2$ and $SiO_2$ are especially preferable. By using a material such as this, good insulation can be maintained in the steps after the formation of the insulating film, while the first film formed on the insulating film surface can be formed in a different crystal state as a second region.

The insulating film is preferably formed in an amorphous state. This allows the second region formed on the insulating film to reduce the stress between the nitride semiconductor layer and the first film formed from a crystalline material, and thereby maintain good adhesion.

The thickness of the insulating film is preferably about 0.1 to 0.5 μm.

The insulating film can be formed by any method known in this field. Examples include vapor deposition and sputtering (reactive sputtering, ECR plasma sputtering, magnetron sputtering). Alternatively, one of these methods may be combined with an oxidation treatment (heat treatment).

(End Face Protective Film)

The end face protective film is provided to reflect laser light and to protect the cavity plane. The end face protective film is formed from an insulating material, and is formed from a material with a lower refractive index than that of the nitride semiconductor, and particularly the active layer.

The end face protective film is formed from the cavity plane all the way to the nitride semiconductor layer and insulating film. It is formed at least from the cavity plane X1 to the end face Y1 of the insulating film, and as shown in FIG. 4, it is preferably formed from X1 to X2, Y1, and Y2. If it extends to Y2, it preferably covers the insulating film in a length of about 5 to 40 μm in the cavity plane direction, and more preferably covers about 10 to 30 μm.

The end face protective film can be formed all the way to the nitride semiconductor layer top face and the insulating film surface by suitably adjusting the microwave power, the RF power, the angle of the cavity plane opposite the target, and so forth.

The end face protective film may be formed over the entire width direction of the nitride semiconductor laser element, or may be over only part of this. It should be formed at least in the waveguide region and its surroundings.

The end face protective film should be formed on at least one of the two opposing cavity planes.

The end face protective film can be formed by any method known in this field. For example, it can be formed by vapor deposition, sputtering (reactive sputtering, ECR plasma sputtering, magnetron sputtering), CVD, or a combination of two or more of these methods, or by a combination of these methods with an oxidation treatment (heat treatment). ECR plasma sputtering is especially preferable.

Pretreatment of the cavity plane, for example, irradiation with a plasma containing a rare gas (such as argon, helium, or xenon), nitrogen, oxygen, or ozone gas; oxidation treatment; heat treatment; exposure treatment, or the like may be performed prior to forming the end face protective film.

The cavity plane can be formed in any plane, including the M plane, the C plane, the A plane, and the R plane. These planes may also be a plane having an off angle.

The cavity plane is preferably formed by etching or cleavage.

If the end face protective film is formed from the cavity plane all the way to the top face of the nitride semiconductor layer, it is formed flat (a flat component 73 of the end face protective film) on the cavity plane as shown in FIG. 4, but a curved component 74 of end face protective film is formed near the corners of the nitride semiconductor. When laser light is reflected by the curved component 74, a ripple may be created in the FFP (Far Field Pattern). In particular, when the end of the insulating film is provided apart from the cavity plane as in this embodiment, the curved component 74 is formed lower, by an amount equivalent to the thickness of the insulating film 30, than when the insulating film 30 is provided up to the cavity plane. Furthermore, with the cavity plane on the light reflecting side, on which there are more pairs in order to raise the reflectivity of the end face protective film and the end face protective film is thicker, the beam diameter become larger when the laser beam reaches the outermost surface of the end face protective film, so the laser beam is reflected by the curved component and a ripple is easily created in the FFP. Accordingly, the end on the lower side of the curved component of the end face protective film is preferably provided above the top face of the nitride semiconductor layer, at least from the active layer to the top face of the nitride semiconductor layer, preferably as indicated by the dotted line in FIG. 4. This suppresses the reflection of the laser beam by the curved component.

As described above, the thicker is the end face protective film, the larger is the beam diameter when the laser beam reaches the outermost surface of the end face protective film, and the more likely it is that a ripple will be created in the FFP by reflection at the curved component, so the total thickness of the end face protective film is preferably 900 nm or less, in particular, the total thickness of the end face protective film on the light reflecting side is preferably 900 nm or less. Setting the film thickness to 900 nm or less suppresses the creation of a ripple in the FFP since the laser beam is less likely to hit the curved component when the beam reaches the outermost surface of the end face protective film.

(First Film)

The first film is the part of the end face protective film that is provided in contact with the cavity plane. Its main purpose is to protect the cavity plane.

The first film is formed from a hexagonal material, a nitride film such as $Al_xGa_{1-x}N$ ($0<x\leq1$). It is especially favorable to form the first film from AlN.

The first film is formed from a different material from that of the insulating film 30. This is because forming the first film over different bases, namely, the nitride semiconductor and the insulating film, allows a first region and a second region to be provided in the first film.

Also, the first film preferably includes single crystals in the first region. This allows a high COD level to be maintained even during the formation of the first film, without causing any lift between the first protective film and the cavity plane during or after the drive of the laser element.

In the first region, if the cavity plane is the M plane, the first region preferably exhibits m axial orientation in the region of the cavity plane that is in contact with the AlGaN layer, and c axial orientation in the region that is in contact with the InGaN layer. Also, m axial orientation and c axial orientation are preferably both present in the region that is in contact with the AlGaN layer (which contains a small amount of aluminum), the GaN layer, and the InGaN layer (which contains a small amount of indium). Consequently, adhesion is better between the first film and the cavity plane, and it is less likely that there will be a change in the COD level as drive time passes.

The first film preferably includes polycrystalline or amorphous in the second region. This allows stress to be relieved in the first region, so good adhesion can be maintained between the first film and the nitride semiconductor layer.

That is, with the first film, the first region and second region are preferably different in terms of their crystallinity or crystal state.

The crystal state of the end face protective film is classified as either single crystal, polycrystal, or amorphous, depending on the degree of crystallization of the material constituting the end face protective film. The crystal state of the end face protective film can be checked by observation with a transmission electron microscope (TEM), a scanning transmission electron microscope (STEM), a scanning electron microscope (SEM) or the like, by electron beam diffraction, by subjecting the pattern thereof to Fast Fourier transform (FFT), by the difference in the etching rate, and so forth.

In microscope observation, visual differences between the first and second regions will be noted, which are attributable to different crystal states. In particular, in observation by STEM, TEM, or the like, contrast (bright and dark areas) is produced by different states of the film (in the case of a crystalline film, its crystallinity or crystal state).

Also, the layout of the elements constituting the crystals can be visually ascertained by electron beam diffraction. When an electron beam is incident on the film, an electron beam diffraction image appears corresponding to the planar orientation and the size of the lattice constant. For example, with a single crystal, since the crystal planes are more or less aligned, the diffraction points are seen to be arranged in a regular pattern. With a polycrystal, since it is made up of microcrystals, the orientation of the individual lattice planes is not consistent, and the diffraction points may be seen in a state of being put together in a complex fashion, or may appears as a Debye ring. With an amorphous material, on the other hand, since there is no structure in which the atomic layout is periodic over long distances, there is no electron beam diffraction, and no diffraction points will be observed in the diffraction image. An electron beam diffraction image can be observed by slicing the end face where the first film is formed so as to expose a cross section of the first film, and then directing an electron beam at this.

It is good for the thickness of the first film to be about 5 to 500 nm, for example, with about 5 to 100 nm being preferable. With the nitride semiconductor laser element in an embodiment, this first film may be formed on the cavity planes on both the light emitting side and the reflecting side. Also, the second region is preferably thinner than the first region, which prevents cracks from developing in the first film.

(Second Film)

The second film is provided on the first film, and functions to protect the first film and as a reflective mirror.

The second film can be a single layer, or may be formed as a multilayer film made up of a pair comprising a low refraction index layer and a high refraction index layer. The second film is formed on at least the cavity plane on the reflecting side, but may also be formed on the cavity plane on the emission side. A single layer film may be formed on the cavity plane on the emission side, and a multilayer film on the cavity plane on the reflecting side.

To obtain the desired refraction index, the material, thickness, number of pairs of multilayer films, and so forth of the second film can be adjusted as needed. The thickness of each layer can be adjusted as needed according to the material being used and so forth, and is determined by the desired oscillation wavelength ($\lambda$) and the refractive index (n) at $\lambda$ of the material being used. More specifically, the thickness is preferably set to be an integer multiple of $\lambda/(4n)$, and is preferably adjusted as needed by taking the refraction index into account.

For instance, with a laser element having an oscillation wavelength of 405 nm, an example of the thickness is about 40 to 70 nm in the case of $Ta_2O_5/SiO_2$. With a multilayer film such as this, there may be two or more pairs, and preferably there are about 5 to 15 pairs, for example. The thickness of the entire second film is about 50 to 900 nm, for example.

The material, film thickness, and number of pairs are preferably adjusted so that the reflectivity will be 11% on the emission side and 95% on the reflecting side. It is preferably that the second film is thicker than the first film.

The second film can be formed from an oxide film, nitride film, oxynitride film, a combination of these, or the like. More specifically, examples thereof include $SiO_2$, $Al_2O_3$, $Ta_2O_5$, $HfO_2$, $ZrO_2$, $TiO_2$, $Nb_2O_5$, SiN, SiON, and AlON. Also, if the insulating film is provided apart from the cavity plane as in this embodiment, since the curved component 74 is formed near the part where laser light is emitted, it is preferable to use a material containing $SiO_2$, $Al_2O_3$, $Ta_2O_5$, or $HfO_2$. If the second film is formed as a multilayer film, $SiO_2/Ta_2O_5$, $SiO_2/HfO_2$, or another such combination is preferable. Since there is substantially no absorption of light of the oscillation wavelength at the oscillation wavelength of the nitride semiconductor laser element, degradation of the cavity plane can be suppressed.

The phrase "substantially no absorption of light of the oscillation wavelength" shall be interpreted to mean that the optical transmissivity of the material formed as a film on the substrate, as measured by spectroscopic ellipsometer, does not drop below 5% at the oscillation wavelength as compared to the optical transmissivity of the substrate. More specifically, it shall be interpreted to be measured by forming a film of the material in question in a thickness of about 1 µm on a glass substrate using an HS-190 made by the J.A. Woollam company.

The second film is preferably formed as an amorphous film.

(Third Film)

Figure 8:
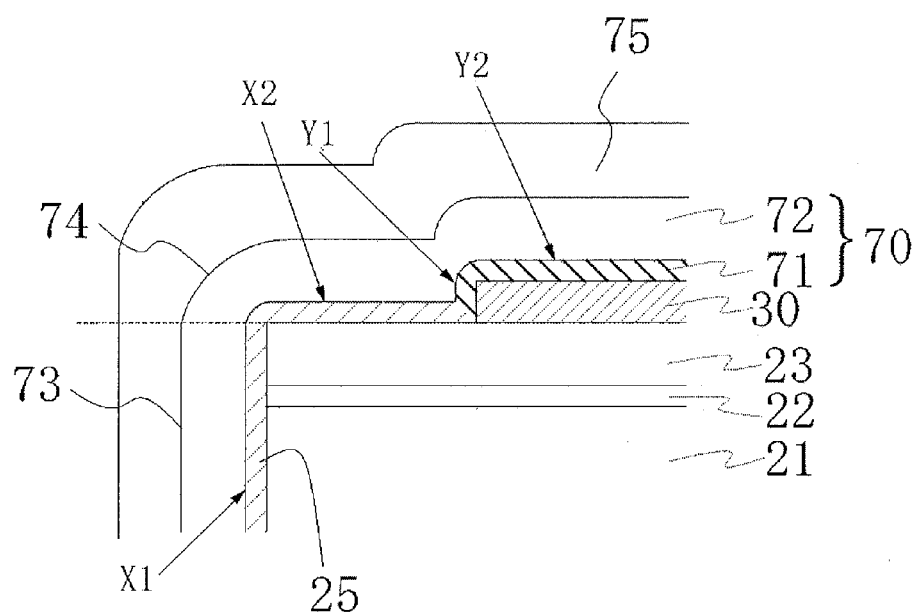
FIG. 8 is a main enlarged view describing the structure of the nitride semiconductor laser element of another embodiment according to the present invention.

A third film 75 may also be formed on the second film as a protective layer for the end face protective film and the second film as shown in FIG. 8. The material of the third film can be selected by taking into account the stability in the usage atmosphere and adhesion to the end face protective film. More specifically, it is preferably formed from $Al_2O_3$ or $SiO_2$. The film thickness is about 10 to 300 nm, for example. Just as with the second film, this may be formed as an amorphous film.

(Nitride Semiconductor Layer)

The nitride semiconductor layer 20 may include a layer having a general formula of $In_aAl_bGa_{1-a-b}N$ ($0 \leq a \leq 1$, $0 \leq b \leq 1$, $0 \leq a+b \leq 1$). In addition to this, a nitride semiconductor layer which is partially substituted with B as a group III element, or a part of N as a Group V element is substituted by P or As may be used. The n-side semiconductor layer 21 may be doped with at least one n-type impurity of group IV elements or group VI elements or the like, such as Si, Ge, Sn, S, O, Ti, Zr, and Cd. The p-side semiconductor layer 23 may be doped with a p-type impurity, such as Mg, Zn, Be, Mn, Ca, Sr, or the like. The impurity is preferably contained in a concentration region of, for example, about $5 \times 10^{16}/cm^3$ to $1 \times 10^{21}/cm^3$.

The active layer 22 may be either of a multiquantum well structure or a single quantum well structure. The nitride semiconductor layer 20 may have a SCH (Separate Confinement Heterostructure) in which the active layer is interposed between the optical waveguides provided at the n-side semiconductor layer and the p-side semiconductor layer which constitute an optical guide layer. The present invention is not limited by these structures.

Growth method of the nitride semiconductor 20 is not particularly limited and any method known as a growth method of nitride semiconductor such as MOCVD (Metal Organic Chemical Vapor Deposition), HVPE (Hydride Vapor Phase Epitaxy), MBE (Molecular Beam Epitaxy), and so on, can be employed.

The ridge 24 is formed on the top face of the p-side semiconductor layer of the nitride semiconductor layer. The ridge functions as a waveguide region, and it can be formed in a width ranging from 1.0 to about 30.0 µm. The height of the ridge (the depth of the etching) can be adjusted as needed by adjusting the thickness of the layer constituting the p-side semiconductor layer, the material, and so forth, as well as the extent of optical confinement and the like, and an example is 0.1 to 2 µm. The ridge is preferably set such that its length in the cavity plane direction will be about 100 to 1000 µm. The width need not be the same over the entire cavity plane direction, and the side faces may be vertical or tapered.

The ridge can be formed by any method that is commonly used in this field. For example, it can be formed by photolithography and etching. The etching here may be RIE (reactive ion etching) or other type of dry etching, or wet etching, or both of these may be performed, either in that order or the reverse order.

(Electrodes)

The p-side electrode and n-side electrode can be formed as a single layer film or laminate film of palladium, platinum, nickel, gold, titanium, tungsten, copper, silver, zinc, tin, indium, aluminum, iridium, rhodium, ITO, or other such metal or alloy. The thickness of the electrode film can be suitably adjusted according to the material being used and so forth, and is favorably about 50 to 500 nm, for example. The electrodes should be formed on at least the p-side and n-side semiconductor layers or the substrate, but one or more conductor layers, such as a pad electrode, may also be formed over these electrodes.

(Protective Film)

The protective film 50 may be formed over the insulating film 30. The protective film preferably also covers the sides of the nitride semiconductor layer and/or the sides or surface of the substrate, etc., with or without an insulating protective film in between. The protective film can be formed from an insulating film such as an oxide, nitride, oxynitride, or the like of silicon, zirconium, vanadium, niobium, hafnium, tantalum, aluminum, cerium, indium, antimony, zinc, or the like. The film thickness is about 0.1 to 1 µM, for example.

(Manufacturing Method)

A method of manufacturing a nitride semiconductor laser element of the invention mainly includes following steps;

forming an insulating film on an upper face of a nitride semiconductor layer;

forming cavity planes substantially perpendicular to the upper face of the nitride semiconductor layer such that the cavity planes are apart from the end portions of the insulating film, and forming a first film from $Al_xGa_{1-x}N$ ($0<x\leq1$) and a different material from that of the insulating film to have a first region that is in contact with the nitride semiconductor and a second region that is in contact with the insulating film.

Examples of the nitride semiconductor laser element pertaining to an embodiment will now be described through reference to the drawings, but the present invention is not limited to or by the following examples.

Example 1

As shown in FIGS. 1 to 4, the nitride semiconductor laser element in this example is such that an insulating film is formed in a length of 790 µm, with a cavity plane of 800 µm. The ends of the insulating film on the cavity plane side are each formed 5 µm away from the cavity plane. An end face protective film is formed from the cavity plane to the surface of the insulating film and the top face of the nitride semiconductor layer, and AlN is formed in a thickness of 32 nm as a first film.

The nitride semiconductor laser element in this example can be manufactured as follows.

First, a nitride semiconductor substrate containing an n-type impurity was placed in a MOVPE reaction vessel, and nitride semiconductor layers were grown successively as follows.

(N-side semiconductor layer 21)
Si doped AlGaN 2.4 µm-thick, and
undoped GaN 0.17 µm-thick.

(Active Layer 22)
Si doped $In_{0.02}Ga_{0.98}N$ barrier layer 14 nm-thick,
undoped $In_{0.07}Ga_{0.93}N$ well layer 8 nm-thick,
Si doped $In_{0.02}Ga_{0.98}N$ barrier layer 14 nm-thick,
undoped $In_{0.07}Ga_{0.93}N$ well layer 8 nm-thick, and
Si doped $In_{0.02}Ga_{0.98}N$ barrier 14 nm-thick.

(P-side semiconductor layer 23)
Mg doped AlGaN 10 nm-thick,
undoped GaN 0.15 µm-thick,
undoped AlGaN 2.5 nm-thick and Mg doped AlGaN 2.5 nm-thick with alternately repeating this, a superlattice layer is grown to the total thickness of 0.6 µm, and
Mg doped GaN 15 nm-thick.

The wafer on which the nitride semiconductor layer has been grown is taken out of the reaction vessel, a mask pattern is formed in a specific shape on the top face of the p-side semiconductor layer that is the uppermost layer in order to define the shape of the nitride semiconductor laser element, etching is performed by RIE, and the n-side semiconductor layer is exposed.

Then, a mask pattern is formed in a stripe 1.5 µm wide on the top face of the p-side semiconductor layer that is the uppermost layer, etching is performed by RIE part-way through the p-side semiconductor layer, and a ridge 24 is formed as a stripe 1.5 µm wide.

(Formation of Insulating Film 30)

Then, the insulating film 30 is formed at a distance of 5 µm from the location where the cavity plane is to be formed. A mask pattern is formed in a specific shape by photolithography and lift-off method. A $ZrO_2$ film is formed in a thickness of 200 nm with an ECR sputtering apparatus on the top face of the nitride semiconductor layer.

A p-side electrode 41, comprising nickel, gold, and platinum formed in that order, is formed on the outermost face of the ridge.

A protective film 50 composed of $SiO_2$ is formed from above the insulating film to the side faces of the nitride semiconductor layer and the surface of the previously exposed n-side semiconductor layer.

Then, a p-pad electrode 42 is formed that is electrically connected with the p-side electrode 41.

After this, the substrate is ground to a thickness of about 80 µm, and the n-side electrode 60 is formed on the back of the substrate 10.

(Formation of Cavity Planes 25)

After this, the nitride semiconductor layer and the substrate are cleaved into bars. The bars are cleaved so that the cleavage plane is the (1-100) plane, and this produces a cavity plane.

(Formation of End Face Protective Films 70)

End face protective films are formed on the cavity planes.

First, an AlN film is formed as a first film in a thickness of 32 nm on the emission-side cavity plane, with an ECR plasma sputtering apparatus, using an aluminum target, from the cavity plane to the top face of the nitride semiconductor layer and the surface of the insulating film.

On this, SiO$_2$ is formed as a second film in a thickness of 260 nm with an ECR plasma sputtering apparatus.

Then, an AlN film is formed in a thickness of 32 nm as a first film on the cavity plane on the reflecting side, in the same manner as on the emission side. On this, an SiO$_2$ film was formed in a thickness of 69 nm with a sputtering apparatus and using a silicon target, and a Ta$_2$O$_5$ film was formed in a thickness of 46 nm. Films of SiO$_2$ and Ta$_2$O$_5$ were repeatedly formed, with six periods of (SiO$_2$/Ta$_2$O$_5$) film formation, and this produced the second film on the reflecting side.

Finally, a semiconductor laser element is obtained by cutting chips from the bar in a direction perpendicular to the cavity plane.

(Evaluation)

Figure 6:
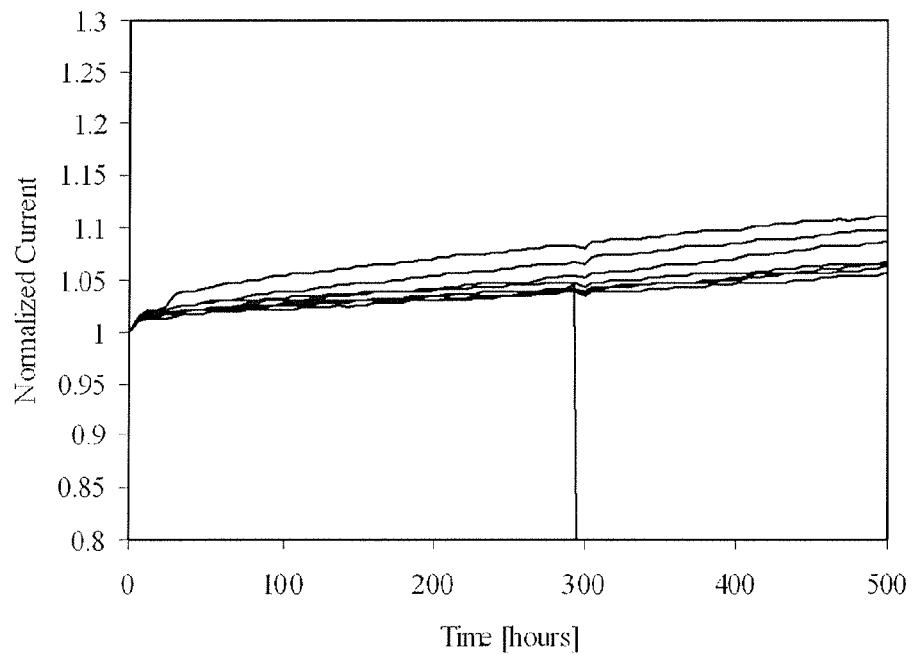
FIG. 6 is a graph of the relation between drive time and drive current, when the initial drive current was normalized, of the nitride semiconductor laser element of an embodiment according to the present invention.

The nitride semiconductor laser element thus obtained was evaluated by die bonding or wire bonding the electrodes and testing the laser oscillation at Tc=25° C., whereupon the threshold current density was found to be 2.3 kA/cine and oscillation was at a wavelength of 405 nm. Eight nitride semiconductor laser elements produced in the same manner were continuously oscillated for 500 hours at Tc=25° C. and an output of 450 mW. The results are shown in FIG. 6, which is a graph of the relation between drive time and drive current when the initial drive current was normalized.

It can be seen from these results that all the elements but one operated stably. Thus, with the nitride semiconductor laser element of this example, adhesion is maintained between the first film and the nitride semiconductor layer even during high-output drive, while an increase in drive current is suppressed and the service life of the element is enhanced.

Figure 7:
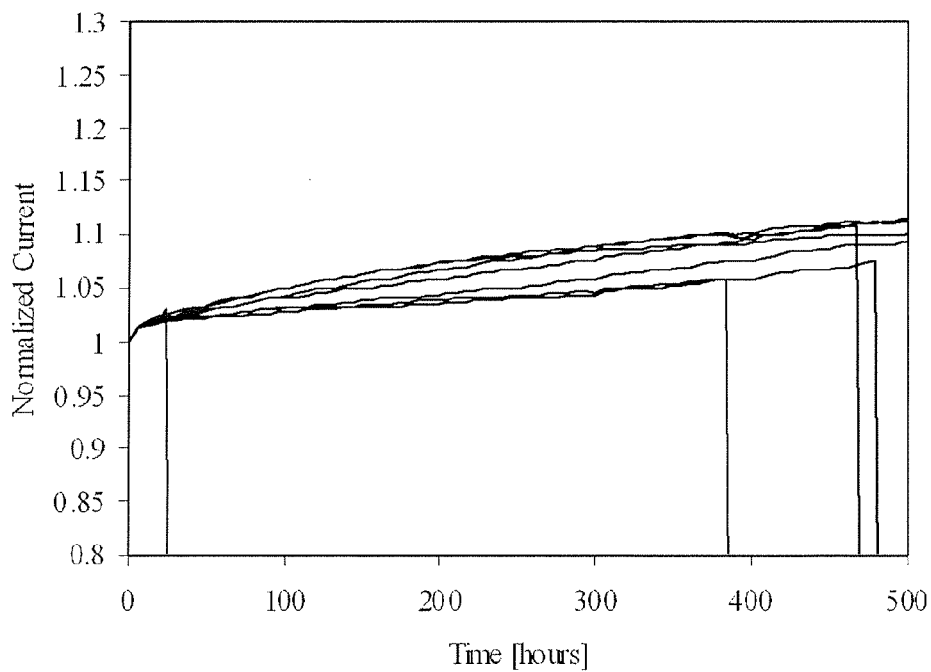
FIG. 7 is a graph of the relation between drive time and drive current, when the initial drive current was normalized, of the nitride semiconductor laser element of comparative embodiment.

For the sake of comparison, nitride semiconductor laser elements were produced in the same way, except that the ends of the insulating film were formed all the way to the cavity planes, and these were continuously oscillated under the same conditions. The results are shown in FIG. 7. It can be seen from these results that sudden breakage occurred in four (half) of the elements by the time 500 hours had elapsed.

Example 2

This example is the same as Example 1, except that the structure of the end face protective film is changed.

A second film (multilayer film) is formed on the emission-side cavity plane, and the number of pairs of second films on the reflecting-side cavity plane is changed. Furthermore, a third film is formed over the emission-side second film.

A first film is formed in the same manner as in Example 1 on the emission-side cavity plane. Then, a film of SiO$_2$ is formed in a thickness of 69 nm and a film of Ta$_2$O$_5$ in a thickness of 46 nm, as second films, with an ECR plasma sputtering apparatus and a silicon target.

First and second films are formed in the same manner as in Example 1 on the cavity plane on the reflecting side. Two periods of (SiO$_2$/Ta$_2$O$_5$) film formation are carried out here. A third film composed of SiO$_2$ is formed in a thickness of 138 nm is formed over the emission-side second film with an ECR plasma sputtering apparatus and a silicon target.

In this example, the same effect as in Example 1 is obtained.

Example 3

This example was the same as Example 1, except that the insulating film is changed to the shape shown in FIG. 5. More specifically, the insulating film 30 formed on both sides of the ridge is formed such that the ends on the cavity plane side are formed away from the cavity planes 25a and 25b at a width of 15 μm from the base of the ridge. The insulating film is formed in the same manner as in Example 1, using the mask pattern mentioned above.

In this example, the same effect as in Example 1 is obtained. Further, as compared to Example 1, there remains a place where the insulating film is formed continuously, so warping of the wafer can be adjusted and a better cleavage plane can be formed.

INDUSTRIAL APPLICABILITY

The nitride semiconductor laser element of the present invention can be utilized in optical disk devices, optical communications systems, projectors, printers, measurement devices, and all other such devices.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents. Thus, the scope of the invention is not limited to the disclosed embodiments.

What is claimed is:

1. A nitride semiconductor laser element comprising:
   a nitride semiconductor layer having cavity planes at ends of a waveguide region,
   an insulating film formed on an upper face of the nitride semiconductor layer so that ends of the insulating film on cavity plane sides are isolated from the cavity planes in plan view, and
   a first film formed from at least one of the cavity planes to an upper face of the nitride semiconductor layer, and covering part of a surface of the insulating film,
   the first film has a first region that is in contact with the nitride semiconductor and a second region that is in contact with the insulating film, and is formed from Al$_x$Ga$_{1-x}$N (0<x≤1) and a different material from that of the insulating film.

2. The nitride semiconductor laser element according to claim 1, wherein the insulating film is formed in an amorphous state.

3. The nitride semiconductor laser element according to claim 2, wherein the first region and second region within the first film are different in terms of their crystallinity or crystal state.

4. The nitride semiconductor laser element according to claim 2, wherein the first film includes single crystals in the first region, and polycrystalline or amorphous in the second region.

5. The nitride semiconductor laser element according to claim 1, wherein the first region and second region within the first film are different in terms of their crystallinity or crystal state.

6. The nitride semiconductor laser element according to claim 5, wherein the first film includes single crystals in the first region, and polycrystalline or amorphous in the second region.

7. The nitride semiconductor laser element according to claim 1, wherein the first film includes single crystals in the first region, and polycrystalline or amorphous in the second region.

8. The nitride semiconductor laser element according to claim 1, wherein the second region of the first film is thinner than the first region of the first film.

9. The nitride semiconductor laser element according to claim 1, wherein the distance away from the cavity plane of the insulating film is about 1 to 20 μm.

10. The nitride semiconductor laser element according to claim 1, wherein the insulating film includes at least one of $ZrO_2$, $HfO_2$, $SiO_2$, $Ta_2O_5$, SiN, SiON, BN, SiC, and SiOC.

11. The nitride semiconductor laser element according to claim 1, wherein a second film is provided on a first film, and the second film is formed from material which is substantially no absorption of light of the oscillation wavelength.

12. The nitride semiconductor laser element according to claim 11, wherein the second film include at least one of $SiO_2$, $Al_2O_3$, $Ta_2O_5$ and $HfO_2$.

13. The nitride semiconductor laser element according to claim 11, wherein the second film is formed in an amorphous state.

14. The nitride semiconductor laser element according to claim 11, wherein the total thickness of the end face protective film on the reflecting side is 900 nm or less.

15. The nitride semiconductor laser element according to claim 11, wherein a third film is formed for protecting the second film on the second film.

* * * * *